(12) United States Patent
Fujii et al.

(10) Patent No.: US 10,486,918 B2
(45) Date of Patent: Nov. 26, 2019

(54) GUIDE ROLLER AND SUBSTRATE TRANSFER APPARATUS

(71) Applicant: SAKAI DISPLAY PRODUCTS CORPORATION, Sakai-shi, Osaka (JP)

(72) Inventors: Takeshi Fujii, Sakai (JP); Yoshihito Mibu, Sakai (JP); Kenichi Nonaka, Sakai (JP)

(73) Assignee: SAKAI DISPLAY PRODUCTS CORPORATION, Sakai-shi, Osaka (JP)

( * ) Notice: Subject to any disclaimer, the term of this patent is extended or adjusted under 35 U.S.C. 154(b) by 0 days.

(21) Appl. No.: 16/079,760

(22) PCT Filed: Feb. 24, 2016

(86) PCT No.: PCT/JP2016/055465
§ 371 (c)(1),
(2) Date: Aug. 24, 2018

(87) PCT Pub. No.: WO2017/145293
PCT Pub. Date: Aug. 31, 2017

(65) Prior Publication Data
US 2019/0071262 A1  Mar. 7, 2019

(51) Int. Cl.
*B65G 49/06* (2006.01)
*B65G 13/07* (2006.01)
(Continued)

(52) U.S. Cl.
CPC ........... *B65G 49/061* (2013.01); *B65G 49/06* (2013.01); *B65G 49/064* (2013.01);
(Continued)

(58) Field of Classification Search
CPC ........ B65G 13/04; B65G 49/06; B65G 39/02; B65G 38/18
(Continued)

(56) References Cited

U.S. PATENT DOCUMENTS 5,454,460 A * 10/1995 Lane ...................... B65G 39/02
193/35 R
8,172,063 B2 * 5/2012 Ho ........................ B65G 49/064
193/35 C
(Continued)

FOREIGN PATENT DOCUMENTS

JP        2008-265995 A    11/2008

*Primary Examiner* — James R Bidwell
(74) *Attorney, Agent, or Firm* — ScienBiziP, P.C.

(57) ABSTRACT

To provide: a guide roller, whereby a replacement operation time can be shortened, guide roller position adjustment operations are not needed, and an equipment stop time can be reduced, and which contributes to suppression of productivity deterioration; and a substrate transfer apparatus provided with the guide roller. A substrate transfer apparatus (1) is provided with transfer rollers (3); a plurality of transfer shafts (2) that are provided with the transfer rollers (3); a guide roller (5) that guides a substrate (10); and a roller holding section (6) having a supporting shaft (62) that supports the guide roller (5) at one end. A contact section (52) of the guide roller (5) in contact with the substrate (10) can be separated from other sections (a base section (51) and a nut section (53)).

5 Claims, 7 Drawing Sheets

(51) Int. Cl.
*B65G 21/20* (2006.01)
*H01L 21/677* (2006.01)
*B65G 47/91* (2006.01)

(52) U.S. Cl.
CPC ...... *B65G 49/067* (2013.01); *H01L 21/67706* (2013.01); *B65G 13/07* (2013.01); *B65G 21/2054* (2013.01); *B65G 47/911* (2013.01); *B65G 49/068* (2013.01); *C03B 2225/02* (2013.01)

(58) Field of Classification Search
USPC .................................................. 193/37, 35 R
See application file for complete search history.

(56) References Cited

U.S. PATENT DOCUMENTS

| | | | |
|---|---|---|---|
| 9,570,332 B2 * | 2/2017 | Zhang | H01L 21/67706 |
| 2014/0151194 A1 * | 6/2014 | Kim | H01L 21/67706 198/780 |
| 2014/0346006 A1 * | 11/2014 | Bae | H01L 21/67706 193/37 |

* cited by examiner

GUIDE ROLLER AND SUBSTRATE TRANSFER APPARATUS

TECHNICAL FIELD

The present invention relates to a guide roller which guides a substrate such as a glass substrate to be used for a liquid crystal display panel, and a substrate transfer apparatus which includes the guide roller.

BACKGROUND ART

Among display apparatuses, a liquid crystal display apparatus is thin and features low power consumption.

The liquid crystal display apparatus includes a liquid crystal display panel and a backlight unit.

The display panel includes a color filter substrate (CF substrate) with a plurality of color filters, a thin film transistor substrate (TFT substrate) with a plurality of thin film transistors (hereinafter referred to as TFTs) which are switching elements, and a liquid crystal layer provided as a display medium layer. The TFT substrate is arranged opposite the CF substrate with a predetermined gap maintained by a spacer, and the liquid crystal layer is arranged between the opposing CF and TFT substrates.

The TFT substrate is provided with a plurality of gate lines (scanning lines) and a plurality of source lines (signal lines) crossing the gate lines over an insulating layer. The pixel-switching TFTs are formed near crossing points of the gate lines and the source lines.

The TFT substrate is produced by repeatedly performing processes such as deposition, photoresist film formation, exposure, developing, etching, and detachment of the photoresist film. Washing may be also performed before and after the processes. The CF substrate is produced through a plurality of processes.

A substrate transfer apparatus is used for transferring a substrate such as the above-described TFT substrate to and from each processing apparatus, or washing the substrate while transferring the substrate.

The substrate transfer apparatus includes a plurality of transfer rollers, a plurality of transfer shafts each provided in a transfer roller, and a plurality of motors. The substrate transfer apparatus also includes a transfer roller rotating section which rotates the transfer rollers through rotation of the transfer shafts, a plurality of lidded cylindrical guide rollers, and two roller holding sections for holding the transfer rollers and the guide rollers (as in Patent Literature 1, for example). The transfer shafts are arranged in a transfer direction of the substrate, and are located such that the transfer rollers make contact with a lower surface of the substrate. Each guide roller is located between two transfer shafts so that a side surface thereof may make contact with a long edge surface of the substrate.

Each roller holding section includes a plate frame section, supporting shafts, and coupling sections. The plate frame section is a long and thin longitudinally placed rectangular plate. The plate frame section supports each transfer shaft on an upper surface of the plate frame section. Each coupling section is perpendicularly mounted to a lower portion of the plate frame section. An upper end of each supporting shaft supports a guide roller through a bearing. The bearing is prevented from moving in an axial direction by a snap ring located on an inner peripheral surface of an opening of the guide roller.

CITATION LIST

Patent Literature

[Patent Literature 1]
Japanese Patent Application Laid-Open Publication No. 2008-265995

SUMMARY OF INVENTION

Technical Problem

When guide rollers are made from synthetic resin and a substrate is made from glass that is harder than the synthetic resin, scratches easily occur in a part of a guide roller which may make contact with the substrate when the substrate is transferred. For example, when a scratch of a certain size such as a depth of 1 mm occurs, the guide roller needs to be replaced due to a concern that the substrate could become scratched.

When the guide roller is replaced, a corresponding supporting shaft is removed from a corresponding coupling section, the guide roller is removed from the supporting shaft and a corresponding bearing, and a new guide roller is installed.

Because the above replacement work requires time, and an installation error occurs during mounting of the supporting shaft, it becomes necessary to adjust for displacement in installing the guide roller and stoppage time of the production equipment is extended. That is, a problem arises that the operation rate of the production equipment decreases and productivity decreases.

The present invention has been made in view of the circumstances described above, and an object thereof is to provide a guide roller capable of shortening the replacement work time, making adjustment of the position of the guide roller unnecessary, capable of shortening stoppage time of the equipment, and helping to prevent a decrease in productivity. The present invention also aims to provide a substrate transfer apparatus including the guide roller.

Solution to Problem

A plurality of guide rollers according to one embodiment of the present invention is arranged along a transfer path of a transferred substrate and guides the substrate so that the substrate does not leave the transfer path. Each guide roller includes a contact section which may make contact with a portion of the substrate. The contact section is separable from a part of the guide roller other than the contact section.

A substrate transfer apparatus according to the embodiment of the present invention includes the above-described guide rollers and a support section which rotatably supports an entirety of each guide roller or only the contact section.

Advantageous Effects of Invention

According to the guide roller of the present invention, the contact section which may make contact with the substrate is separable from a part of the guide roller other than the contact section. Therefore, when a scratch occurs in the contact section due to making contact with the substrate, only the contact section can be separated and replaced with a new contact section. Accordingly, overall part cost can be reduced. Because only the contact section is removed and replaced with a new contact section while the guide roller is mounted to and supported by the support section, stoppage time of equipment can be reduced. This is because the replacement work time can be shortened and the position of the guide roller need not be adjusted. Therefore, productivity can be prevented from decreasing.

DESCRIPTION OF EMBODIMENTS

The present invention will be specifically described as follows based on the drawings which illustrate embodiments of the present invention.

First Embodiment

Figure 1:
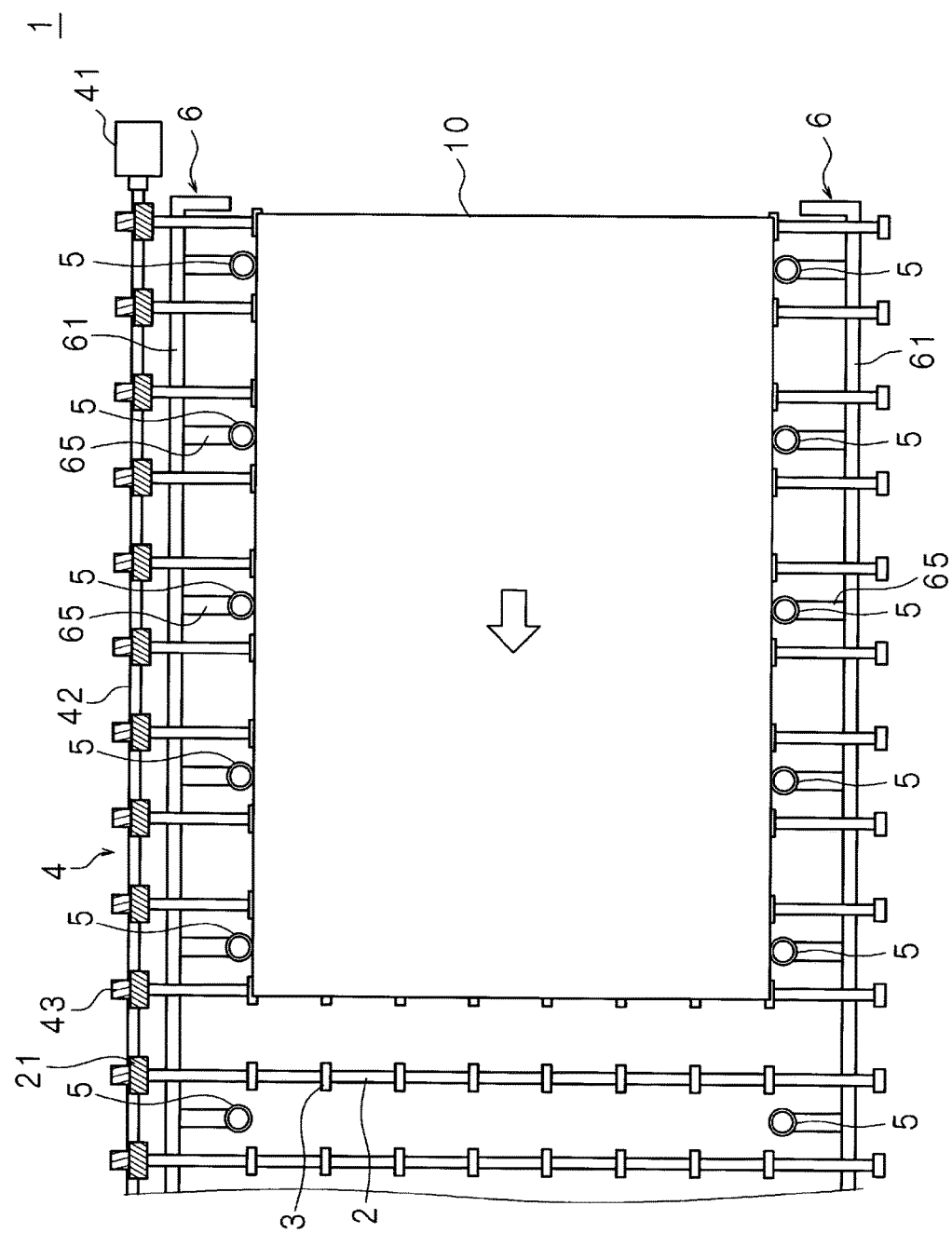
FIG. 1 is a schematic plan view of a substrate transfer apparatus according to a first embodiment.
Figure 2:
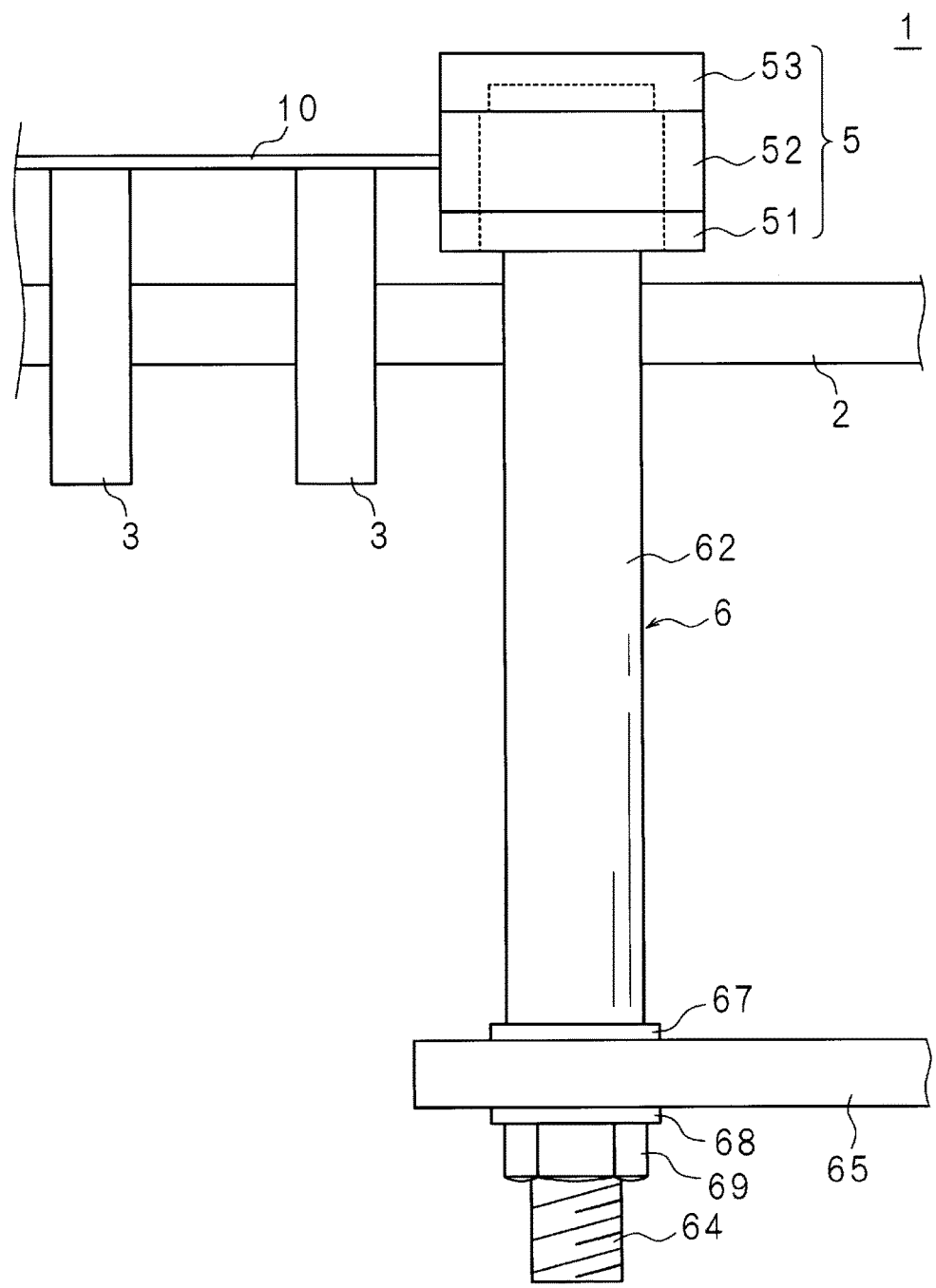
FIG. 2 is a schematic side view illustrating a portion of the substrate transfer apparatus.

FIG. 1 is a schematic plan view of a substrate transfer apparatus 1 according to a first embodiment. FIG. 2 is a schematic side view illustrating a portion of the substrate transfer apparatus 1.

The substrate transfer apparatus 1 is used for transferring a substrate to and from each processing apparatus in a manufacturing process of the substrate and washing the substrate. Examples of the substrate include the TFT substrate and the CF substrate for the liquid crystal display panel of the above-described liquid crystal display apparatus. In the following, the substrate transfer apparatus 1 will be described as transferring a substrate 10 in a horizontal posture.

The substrate transfer apparatus 1 includes a plurality of transfer rollers 3, a plurality of transfer shafts 2 on which the transfer rollers 3 are provided except on both ends of each transfer shaft 2, a transfer roller rotation section 4 for rotating the transfer rollers 3 through rotation of the transfer shafts 2, a plurality of guide rollers 5, and two roller holding sections 6 for holding the transfer rollers 3 and the guide rollers 5.

The transfer roller rotation section 4 includes a motor 41, a shaft section 42 which rotates due to driving force of the motor 41, and a plurality of worms 43 provided on the shaft section 42.

A worm wheel 21 is mounted to one end of each transfer shaft 2. Each worm wheel 21 meshes with the corresponding worm 43.

The substrate 10 is to be placed in a center of the substrate transfer apparatus 1 in a width direction thereof, that is, arranged in a horizontal posture on the transfer rollers 3.

The shaft section 42 rotates due to the driving force of the motor 41. The transfer shafts 2 rotate in a rotational direction that is altered due to the engagement of the worms 43 and the worm wheels 21. The transfer rollers 3 rotate accordingly, and the substrate 10 is guided by the guide rollers 5 and transferred in a direction indicated by an arrow in FIG. 1.

Each roller holding section 6 includes a plate frame section 61, supporting shafts 62, and coupling sections 65. The plate frame section 61 is a long and thin longitudinally placed rectangular plate. The plate frame section 61 is configured so as to support each transfer shaft 2 on an upper surface of the plate frame section 61. Each coupling section 65 is perpendicularly mounted to a lower portion of the plate frame section 61. One end of each supporting shaft 62 supports a guide roller 5 through a bearing 63 (refer to FIG. 5). A male screw 64 is provided on a lower end of the supporting shaft 62. The male screw 64 has a smaller diameter than the rest of the supporting shaft 62. An insertion hole is provided in the coupling section 65 through which a small diameter portion of the supporting shaft 62 is inserted. With the small diameter portion in the insertion hole, a washer 67 in contact with an upper surface of the coupling section 65, and a washer 68 in contact with a lower surface of the coupling section 65, the supporting shaft 62 is fixed to the coupling section 65 by the male screw 64 being fastened such that a nut 69 is in contact with the washer 68. The guide rollers 5 are freely rotatable around the supporting shafts 62, and are located in positions to be in contact with either of a pair of long edge surfaces of the substrate 10.

Figure 3:
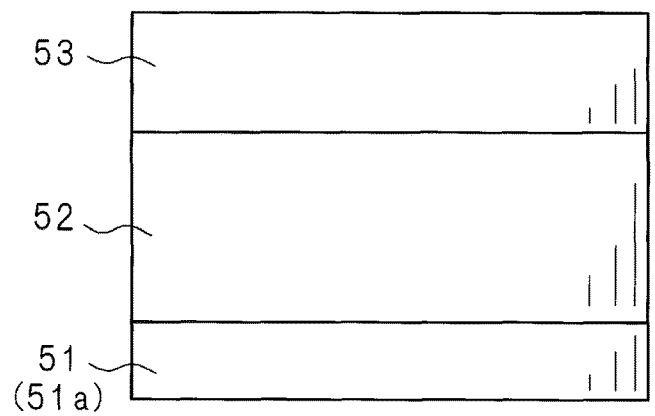
FIG. 3 is a schematic side view of a guide roller.
Figure 4:
FIG. 4 is an exploded side view of the guide roller.
Figure 4:
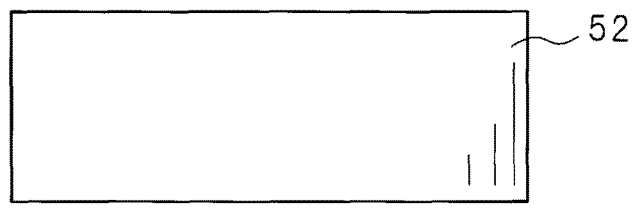
Figure 4:
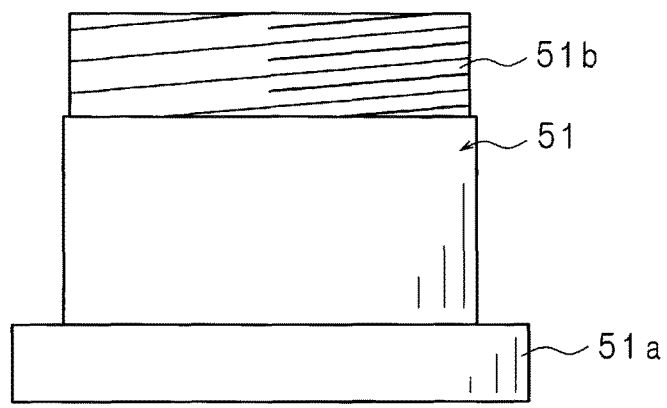
Figure 5:
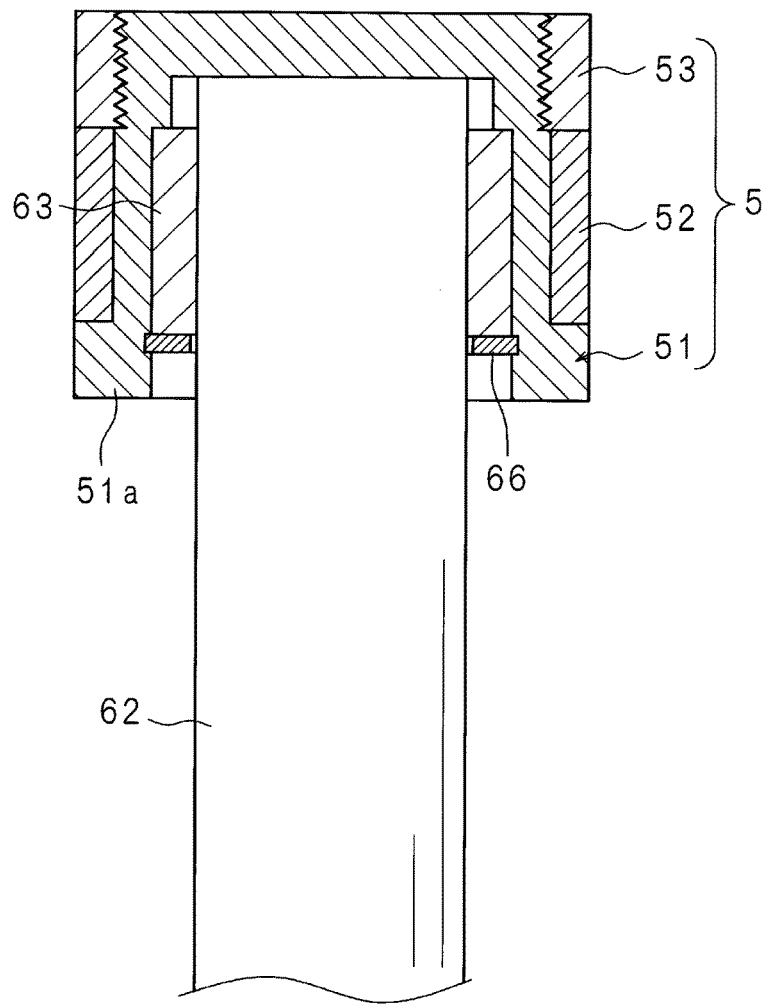
FIG. 5 is a schematic cross-sectional view of the guide roller and a supporting shaft.
Figure 6:
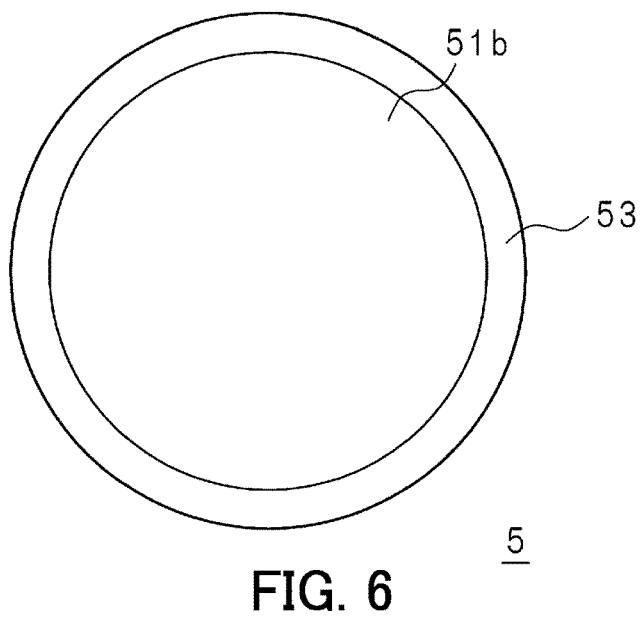
FIG. 6 is a schematic plan view of the guide roller.

FIG. 3 is a schematic side view of a guide roller 5. FIG. 4 is an exploded side view of the guide roller 5. FIG. 5 is a schematic cross-sectional view of the guide roller 5 and the supporting shaft 62. FIG. 6 is a schematic plan view of the guide roller 5.

The guide roller 5 is made from synthetic resin. Examples of the synthetic resin include general-purpose plastic such as polytetrafluoroethylene (PTFE) and engineering plastic such as polyether ether ketone (PEEK). The guide roller 5 can be broken down into three parts: a base section 51, a contact section 52, and a nut section 53.

The base section 51 has an upper lid surface and is cylindrical with an open lower portion. A male screw is provided in a lidded part 51b that has a smaller diameter than the rest of the base section 51, and a flange 51a is provided on the open portion.

The contact section 52 is ring-shaped, fitted to a cylindrical portion of the base section 51, and is secured to the flange 51a and prevented from moving in an axial direction. A width of the contact section 52 is established such that a surface area of the contact section 52 is small and the cost of the contact section 52 is low, thus allowing overall part cost to be reduced. This is because the substrate 10 does not strike the flange 51a or the nut section 53 when the substrate 10 oscillates up and down while being transferred, and only the contact section 52 is to be replaced as explained later. As an example, the width of the contact section 52 is preferably 10 mm to 15 mm when a thickness of the substrate 10 is 0.5 mm to 0.7 mm.

The nut section 53 is fastened to the male screw of the base section 51 above the contact section 52 in FIGS. 3 to 5 and is threaded onto the lidded part 51b of the base section 51. The nut section (movement preventing section) 53 prevents the contact section 52 from moving in the axial direction. The base section 51, the contact section 52, and the nut section 53 are integrated with each other and, in this state, are fitted over the bearing 63 which is fitted over the upper end of the supporting shaft 62. The bearing 63 is prevented from moving in the axial direction by a snap ring 66.

A width of the nut section 53 is established such that the nut section 53 will not come loose when a female screw thereof is fastened to the male screw of the base section 51, and the female screw is therefore easily provided.

The base section 51, the contact section 52, and the nut section 53 are not limited to being made from the same material. The contact section 52 may be made from a different material than that of the other sections. The material is preferably soft and highly elastic. When a substrate is to be transferred and washed, a material that does not swell when wet is chosen. Materials such as silicone rubber, PTFE, and perfluoro alkoxy alkane (PFA) are given as examples.

The guide roller is not limited to a configuration that is broken down into three parts, and may be broken down into four parts. In this case, the guide roller may further include a fastening section which fastens the nut section 53 from above the nut section 53. The width of the contact section 52 is established such that the substrate 10 does not strike the flange 51a of the base section 51 or the nut section 53 when the substrate 10 oscillates. Only the contact section 52 is to be replaced.

As illustrated in FIG. 2, the contact section 52 of the guide roller 5 may make contact with the substrate 10 when the substrate 10 is transferred. The guide roller 5 is made from synthetic resin. In a configuration in which the material of the substrate 10 is glass, that is, the substrate 10 is harder than the guide roller 5, scratches may occur in the contact section 52 when the substrate 10 is transferred. In this case, the guide roller 5 needs to be replaced to prevent scratches from occurring in the substrate 10.

The substrate transfer apparatus 1 of the present embodiment is configured as above. When a scratch occurs in the contact section 52 due to the transfer of the substrate 10, unlike conventional configuration, the nut section 53 is loosened and removed from the lidded part 51b, and the contact section 52 is removed from the base section 51 without removing the supporting shaft 62 from the coupling section 65 and with the base section 51 of the guide roller 5 mounted to the supporting shaft 62.

A new contact section 52 is then fitted to the base section 51, and the original nut section 53 is threaded onto the male screw of the base section 51.

According to the present embodiment, the contact section 52 can be separated from the sections of the guide roller (the base section 51 and the nut section 53) other than the contact section 52 in a simple configuration. The nut section 53 is then readily fixed to the base section 51 by fastening the nut section 53 to the male screw of the base section 51 without using a tool such as a screwdriver or a spanner, and thus the nut section 53, the contact section 52, and the base section 51 can be integrated with each other.

According to the present embodiment, because only the contact section 52 is to be replaced and the entirety of the guide roller 5 is not to be replaced, the supporting shaft 62 need not be removed. Also, the position of the supporting shaft 62 need not be adjusted. Therefore, stoppage time of the equipment can be reduced. Accordingly, productivity can be prevented from decreasing.

Second Embodiment

Figure 7:
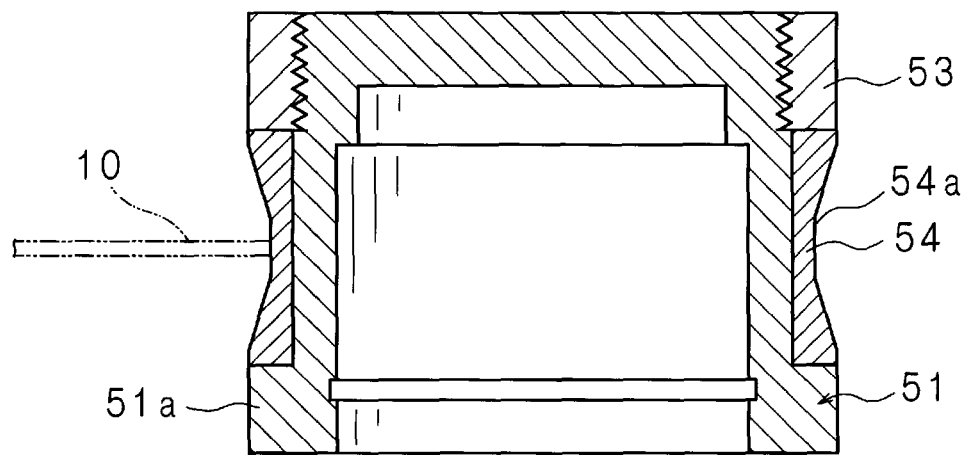
FIG. 7 is a schematic cross-sectional view of a guide roller according to a second embodiment.

FIG. 7 is a schematic cross-sectional view of a guide roller 16 according to a second embodiment. In FIG. 7, elements that are shared with FIG. 5 are labelled with the same reference signs and detailed description thereof will be omitted.

A contact section 54 of the guide roller 16 according to the second embodiment differs from the contact section 52 of the guide roller 5 according to the first embodiment by having a recess 54a indented toward a center in a width direction thereof. A surface of the recess 54a is tapered.

Accordingly, a substrate 10 is guided toward the center by the tapered surface of the recess 54a when the substrate 10 is transferred. The substrate 10 may make contact with the contact section 54 in a suitable range without striking a nut section 53 or a flange 51a, even when the substrate 10 oscillates up and down.

Third Embodiment

Figure 8:
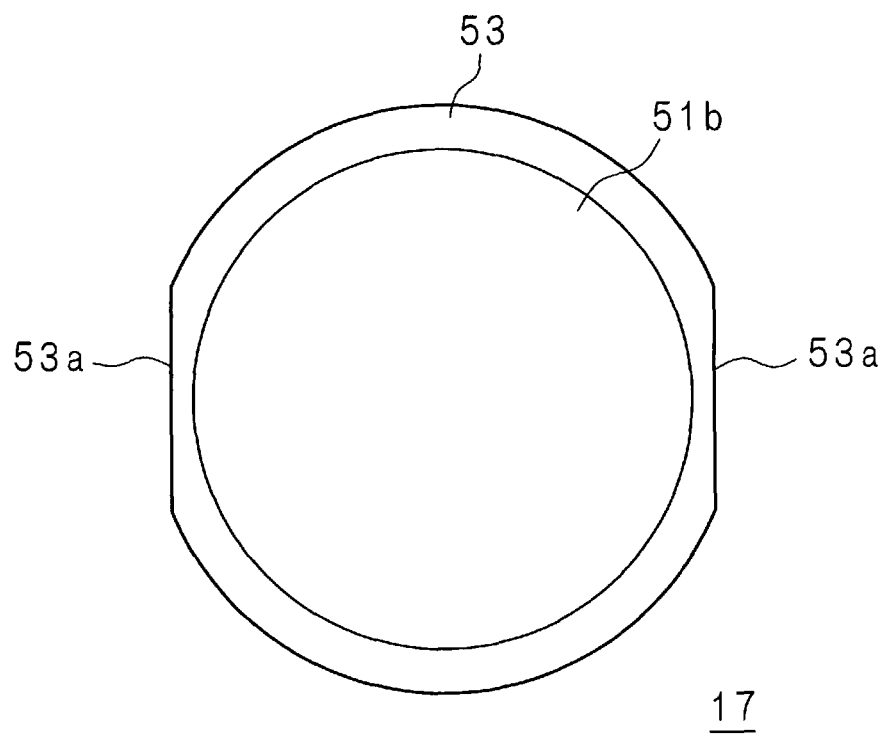
FIG. 8 is a schematic plan view of a guide roller according to a third embodiment.

FIG. 8 is a schematic plan view of a guide roller 17 according to a third embodiment. In FIG. 8, elements that are shared with FIG. 6 are labelled with the same reference signs and detailed description thereof will be omitted.

A nut section 53 of the guide roller 17 has cutaway sections 53a in two places opposite each other in a circumferential direction of the guide roller 17.

The cutaway sections 53a can function as slip resistance when the nut section 53 is tightened with a bare hand or a spanner.

Fourth Embodiment

Figure 9:
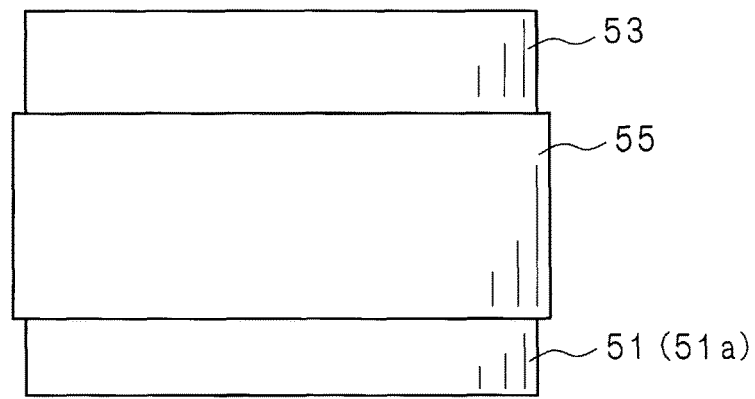
FIG. 9 is a schematic side view of a guide roller according to a fourth embodiment.

FIG. 9 is a schematic side view of a guide roller 18 according to a fourth embodiment. In FIG. 9, elements that are shared with FIG. 3 are labelled with the same reference signs and detailed description thereof will be omitted.

A contact section 55 of the guide roller 18 according to the fourth embodiment differs from the contact section 52 of the guide roller 5 according to the first embodiment by having a larger diameter than the rest of the guide roller 18.

A nut section 53 is fastened to the male screw of a base section 51 above the contact section 55 and threaded onto a lidded part 51b of the base section 51. The base section 51, the contact section 55, and the nut section 53 are integrated with each other and, in this state, are fitted to a supporting shaft 62 and a bearing 63, and rotate.

When a substrate 10 is transferred, the substrate 10 may reliably make contact with the contact section 55 that has a larger diameter than the rest of the guide roller 18, and is prevented from striking the nut section 53 or the base section 51.

Fifth Embodiment

Figure 10:
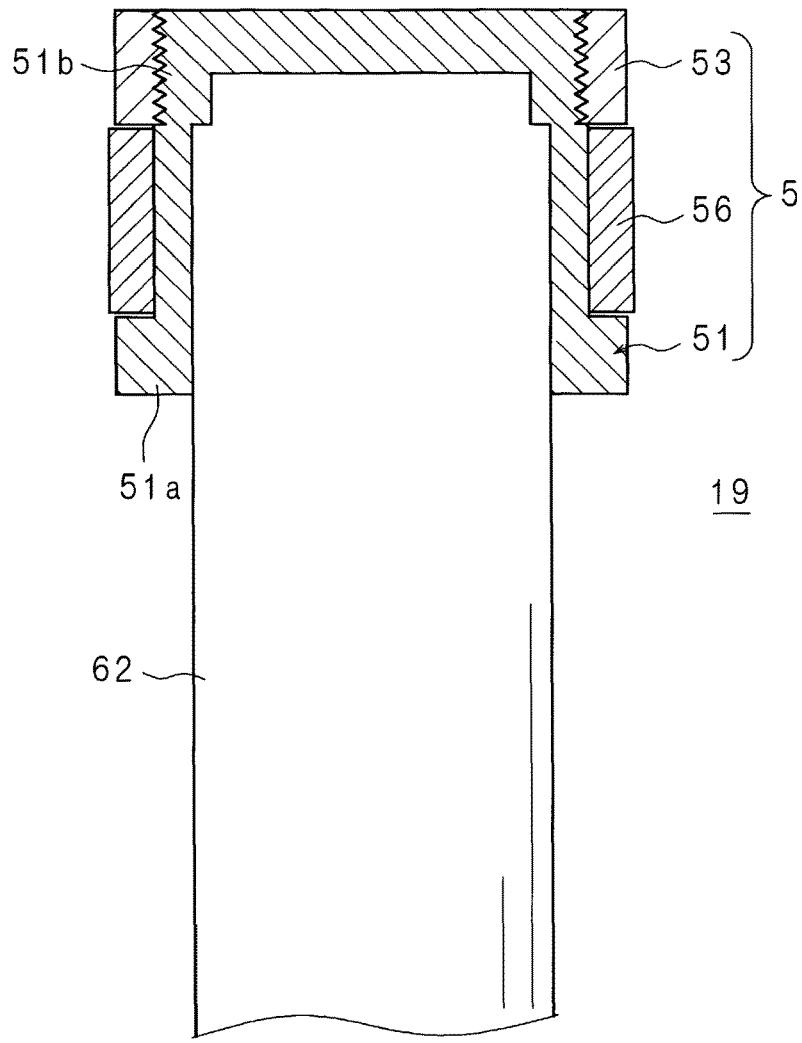
FIG. 10 is a schematic cross-sectional view of a guide roller according to a fifth embodiment.

FIG. 10 is a schematic cross-sectional view of a guide roller 19 according to a fifth embodiment. In FIG. 10, elements that are shared with FIG. 5 are labelled with the same reference signs and detailed description thereof will be omitted.

A contact section 56 of the guide roller 19 according to the fifth embodiment has a larger diameter than the rest of the guide roller 19, similar to the guide roller 18 according to the fourth embodiment.

Unlike the guide roller 18, the guide roller 19 is fitted to a distal end of a supporting shaft 62 without interposing a bearing. The contact section 56 is not integrated with a base section 51 and a nut section 53 when the nut section 53 is fastened to a male screw of the base section 51. Thus, only the contact section 56 rotates with space above and below the contact section 56.

According to the present embodiment, the nut section 53 is loosened and removed from the lidded part 51*b*, and the contact section 56 is removed from the base section 51 without removing the supporting shaft 62 from a coupling section 65 and with the base section 51 of the guide roller 19 mounted to the supporting shaft 62, similar to the first embodiment.

A new contact section 56 is then fitted to the base section 51, and the original nut section 53 is threaded onto the male screw of the base section 51.

Sixth Embodiment

Figure 11:
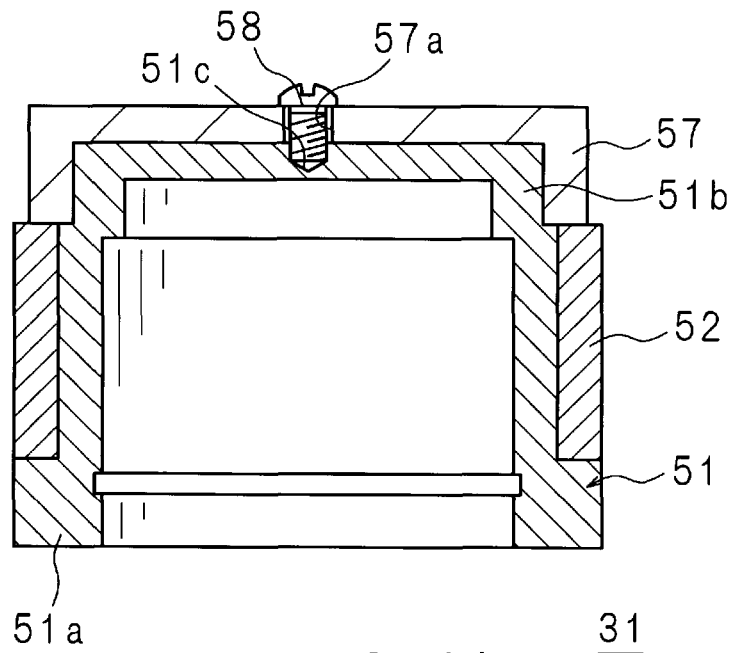
FIG. 11 is a schematic cross-sectional view of a guide roller according to a sixth embodiment.

FIG. 11 is a schematic cross-sectional view of a guide roller 31 according to a sixth embodiment. In FIG. 11, elements that are shared with FIG. 5 are labelled with the same reference signs and detailed description thereof will be omitted.

A male screw is not provided in a lidded part 51*b* of a base section 51 in the guide roller 31 according to the sixth embodiment. Instead of a nut section 53, the guide roller 31 includes a lid section (movement preventing section) 57 covering lid and side surfaces of the lidded part 51*b* of the base section 51. A screw insertion hole 57*a* is provided in a center of the lid section 57, and a female screw 51*c* is provided for the screw insertion hole 57*a* in the lidded part of the base section 51. A screw 58 is inserted into the screw insertion hole 57*a* and fastened to the female screw 51*c*, thereby integrating the base section 51, a contact section 52, and the lid section 57 with each other. Thus, the contact section 52 is prevented from moving in an axial direction.

According to the present embodiment, when a scratch occurs in the contact section 52 due to the transfer of a substrate 10, the screw 58 is loosened to remove the lid section 57 from the base section 51 and the contact section 52 is removed from the base section 51 without removing a supporting shaft 62 from a coupling section 65 and with the base section 51 of the guide roller 31 mounted to the supporting shaft 62.

After a new contact section 52 is fitted to the base section 51 and secured to a flange 51*a*, the lid section 57 is fitted to the lidded part of the base section 51, and the screw 58 is inserted into the screw insertion hole 57*a* and fastened to the female screw 51*c*.

According to the present embodiment, the lid section 57 can be fixed to the base section 51, and the lid section 57, the contact section 52, and the base section 51 can be integrated with each other in a simple configuration.

Note that the screw insertion hole 57*a* is not limited to being provided in the center of the lid section 57. The screw insertion hole 57*a* may be provided in an eccentric location on the lid section 57.

Also according to the present embodiment, because the entirety of the guide roller 31 is not to be replaced and only the contact section 52 is to be replaced, the supporting shaft 62 need not be removed and the position of the supporting shaft 62 need not be adjusted. Therefore, stoppage time of the equipment can be reduced. Accordingly, productivity can be prevented from decreasing.

Note that the lid section 57 is not limited to being screwed to the lidded part of the base section 51. The lid section 57 may be fitted to the lidded part of the base section 51 by pressure.

Seventh Embodiment

Figure 12:
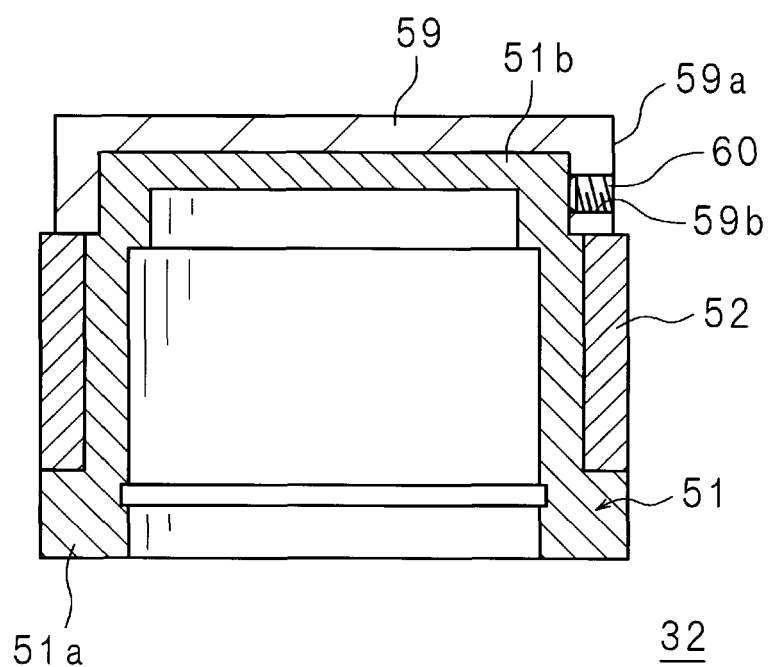
FIG. 12 is a schematic cross-sectional view of a guide roller according to a seventh embodiment.

FIG. 12 is a schematic cross-sectional view of a guide roller 32 according to a seventh embodiment. In FIG. 12, elements that are shared with FIG. 11 are labelled with the same reference signs and detailed description thereof will be omitted.

The guide roller 32 according to the seventh embodiment includes a lid section (movement preventing section) 59 covering lid and side surfaces of a lidded part of a base section 51, similar to the guide roller 31. A cutaway section 59*a* similar to that of the nut section 53 in FIG. 8 is provided on the side surface of the lid section 59, and a female screw 59*b* is provided in the cutaway section 59*a* so as to reach the lidded part 51*b* of the base section 51 from an outer surface of the cutaway section 59*a*. The base section 51, a contact section 52, and the lid section 59 are integrated with each other by a stopping screw 60 fastened to the female screw 59*b*.

According to the present embodiment, when a scratch occurs in the contact section 52 due to the transfer of a substrate 10, the stopping screw 60 is loosened to remove the lid section 59 from the base section 51 and the contact section 52 is removed from the base section 51 without removing a supporting shaft 62 from a coupling section 65 and with the base section 51 of the guide roller 32 mounted to the supporting shaft 62.

After a new contact section 52 is fitted to the base section 51 and secured to a flange 51*a*, the lid section 59 is fitted to the lidded part 51*b* of the base section 51, and the stopping screw 60 is fastened to the female screw 59*b*.

According to the present embodiment, the lid section 59 can be fixed to the base section 51, and the lid section 59, the contact section 52, and the base section 51 can be integrated with each other in a simple configuration.

Also according to the present embodiment, because the entirety of the guide roller 32 is not to be replaced and only the contact section 52 is to be replaced, the supporting shaft 62 need not be removed and the position of the supporting shaft 62 need not be adjusted. Therefore, stoppage time of the equipment can be reduced. Accordingly, productivity can be prevented from decreasing.

Note that the presently disclosed first to seventh embodiments are merely examples in all aspects and should not be construed to be limiting. The scope of the present invention is indicated by the claims, rather than by the description given above, and includes all variations that are equivalent in meaning and scope to the claims.

For example, a substrate guided by the guide rollers is not limited to a substrate used for a liquid crystal display panel. Also, the substrate transfer apparatus is not limited to a case in which the substrate is transferred in a horizontal posture. The substrate may be transferred in a vertical posture or a diagonal posture.

REFERENCE SIGNS LIST

1 Substrate transfer apparatus
2 Transfer shaft
3 Transfer roller
4 Transfer roller rotation section
5, 16, 17, 18, 19, 31, 32 Guide roller
51 Base section
51*a* Flange
51*b* Lidded part
52, 54, 55, 56 Contact section
53 Nut section (movement preventing section)

53a, 59a Cutaway section
54a Recess
57, 59 Lid section (movement preventing section)
57a Screw insertion hole
58 Screw
6 Roller holding section
60 Stopping screw
61 Plate frame section
62 Supporting shaft
63 Bearing
64 Male screw
65 Coupling section
66 Snap ring
67, 68 Washer
69 Nut
10 Substrate

The invention claimed is:

1. A guide roller, a plurality of which is arranged along a transfer path of a glass substrate being transferred and guides the glass substrate so that the glass substrate does not leave the transfer path, the guide roller comprising:
   a contact section which may make contact with the glass substrate;
   a base section which is cylindrically shaped; and
   a movement preventing section, wherein
   the contact section is separable from a part of the guide roller other than the contact section,
   the base section further has a lidded part, an open portion, and a flange provided on the open portion,
   the contact section is ring-shaped, fitted to a cylindrical portion of the base section, and secured to the flange, and
   the movement preventing section is fitted to the lidded part of the base section and prevents the contact section from moving in an axial direction.

2. The guide roller according to claim 1, wherein
   a male screw is provided in the lidded part of the base section,
   a female screw is provided in an inner peripheral surface of the movement preventing section, and
   the movement preventing section is lidded and cylindrical, and is fitted over the lidded part of the base section.

3. The guide roller according to claim 1, wherein
   a side surface of the movement preventing section is screwed to a side surface of the lidded part of the base section.

4. The guide roller according to claim 1, wherein
   the contact section has a larger diameter than the sections of the guide roller other than the contact section.

5. A substrate transfer apparatus comprising:
   the guide roller according to claim 1; and
   a support section rotatably supporting an entirety of the guide roller or only the contact section.

* * * * *